United States Patent
Coskun et al.

(10) Patent No.: US 10,429,744 B2
(45) Date of Patent: Oct. 1, 2019

(54) IMAGE IMPROVEMENT FOR ALIGNMENT THROUGH INCOHERENT ILLUMINATION BLENDING

(71) Applicant: Applied Materials, Inc., Santa Clara, CA (US)

(72) Inventors: Tamer Coskun, San Jose, CA (US); Hwan J. Jeong, Los Altos, CA (US)

(73) Assignee: APPLIED MATERIALS, INC., Santa Clara ( * ) Notice: Subject to any disclaimer, the term of this patent is extended or adjusted under 35 U.S.C. 154(b) by 0 days.

(21) Appl. No.: 16/016,162

(22) Filed: Jun. 22, 2018

(65) Prior Publication Data

US 2018/0373161 A1     Dec. 27, 2018

Related U.S. Application Data

(60) Provisional application No. 62/525,021, filed on Jun. 26, 2017.

(51) Int. Cl.
    *G03B 27/32*      (2006.01)
    *G03B 27/42*      (2006.01)
    (Continued)

(52) U.S. Cl.
     CPC ...... *G03F 7/70483* (2013.01); *G03F 7/70291* (2013.01); *G03F 9/7088* (2013.01);
     (Continued)

(58) Field of Classification Search
     CPC ........ G03F 9/70; G03F 9/7003; G03F 9/7084; G03F 9/7088; G03F 7/70508;
     (Continued)

(56) References Cited

U.S. PATENT DOCUMENTS

| | | | |
|---|---|---|---|
| 2005/0012928 A1* | 1/2005 | Sezginer | G01B 11/26 356/401 |
| 2005/0128450 A1* | 6/2005 | Schroeder | G03F 7/70291 355/53 |

(Continued)

FOREIGN PATENT DOCUMENTS

| | | |
|---|---|---|
| JP | 2013197334 A | 9/2013 |
| WO | 2004001508 A2 | 12/2003 |
| WO | 2016107798 A1 | 7/2016 |

OTHER PUBLICATIONS

International Search Report/Written Opinion issued in PCT/US2018/038327 dated Oct. 11, 2018.

*Primary Examiner* — Mesfin T Asfaw
(74) *Attorney, Agent, or Firm* — Patterson + Sheridan LLP

(57) ABSTRACT

Methods and apparatuses are provided that determine an offset between actual feature/mark locations and the designed feature/mark locations in a maskless lithography system. For example, in one embodiment, a method is provided that includes opening a camera shutter in a maskless lithography system. Light is directed from a configuration of non-adjacent mirrors in a mirror array towards a first substrate layer. An image of the first substrate layer on a camera is captured and accumulated. Light is directed and images are captured repeatedly using different configurations of non-adjacent mirrors to cover an entire field-of-view (FOV) of the camera on the first substrate layer. Thereafter, the camera shutter is closed and the accumulated image is stored in memory.

17 Claims, 6 Drawing Sheets

(51) Int. Cl.
*G03F 7/20* (2006.01)
*G06T 7/00* (2017.01)
*H04N 5/235* (2006.01)
*G03F 9/00* (2006.01)

(52) U.S. Cl.
CPC ......... *G06T 7/0004* (2013.01); *H04N 5/2353* (2013.01); *G06T 2207/30148* (2013.01)

(58) Field of Classification Search
CPC ............... G03F 7/70633; G03F 9/7026; G03F 7/70141; G03F 7/70291; G03F 7/70391; G03F 9/7019; G03F 9/7046; G03F 9/7076
See application file for complete search history.

(56) References Cited

U.S. PATENT DOCUMENTS

| | | |
|---|---|---|
| 2007/0222088 A1 | 9/2007 | Smith et al. |
| 2011/0116064 A1 | 5/2011 | Ahn et al. |
| 2014/0254916 A1* | 9/2014 | Lee .................... G03F 7/70633 382/145 |

* cited by examiner

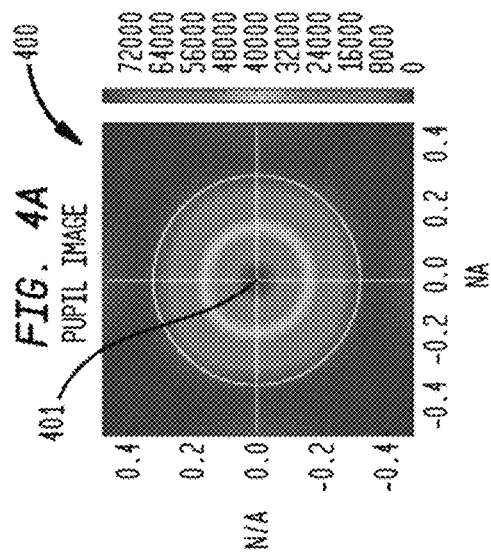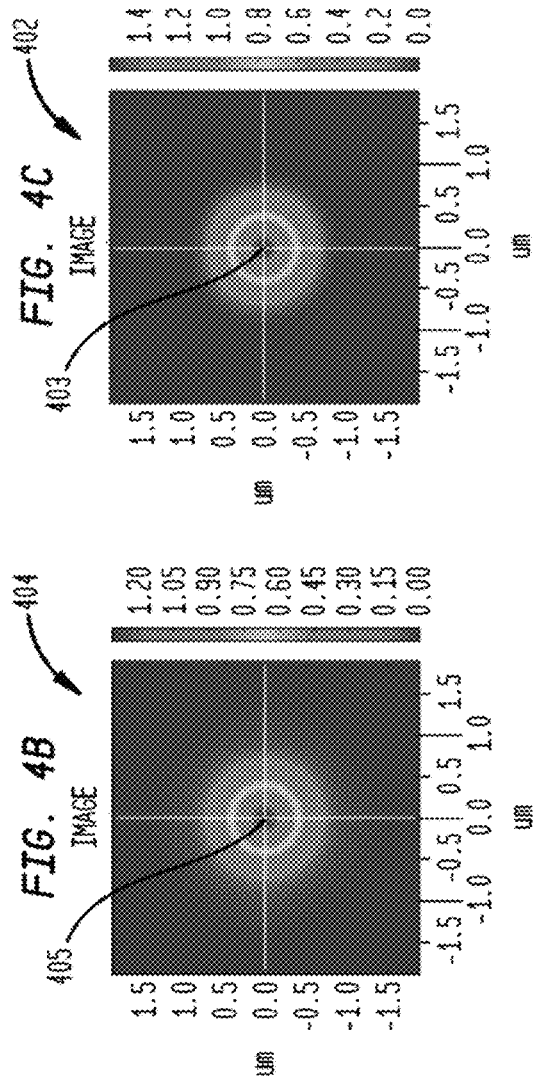

IMAGE IMPROVEMENT FOR ALIGNMENT THROUGH INCOHERENT ILLUMINATION BLENDING

CROSS-REFERENCE TO RELATED APPLICATIONS

This application claims benefit of U.S. Provisional Patent Application Ser. No. 62/525,021, filed Jun. 26, 2017, which is herein incorporated by reference.

BACKGROUND

Field

Embodiments of the present disclosure generally relate to the field of maskless lithography and more specifically to reducing measurement error of an actual location of alignment mark and/or feature on a substrate.

Description of the Related Art

Microlithography techniques are generally employed to create electrical features on a substrate. A light-sensitive photoresist is typically applied to at least one surface of the substrate. Then, either a photolithography mask or pattern generator like a micro-mirror array exposes selected areas of the light-sensitive photoresist as part of a pattern. Light causes chemical changes to the photoresist in the selected areas to prepare these selected areas for subsequent material removal and/or material addition processes to create the electrical features. The precise placement of the electrical features upon the substrate determines the quality of the electrical interconnections.

Alignment techniques are implemented during manufacturing processes to ensure correct alignment of the various layers with one another. Typically, alignment marks are utilized in the layers to assist in the alignment of features in different layers. An increased accuracy in identification of a location of the alignment mark(s) may provide a more accurate alignment of the layers and therefore reduction in overlay error.

Therefore, there is a need in the art for increased accuracy in aligning layers.

SUMMARY

Embodiments of the present disclosure generally relate to determining a more accurate location of alignment mark and/or feature on a substrate. For example, in one embodiment, a method is provided that includes opening a camera shutter in a maskless lithography system. Light is directed from a configuration of non-adjacent mirrors in a mirror array towards a first substrate layer. An image of the first substrate layer on a camera is captured and accumulated. Light is directed and images are captured repeatedly using different configurations of non-adjacent mirrors to cover an entire field-of-view (FOV) of the camera on the first substrate layer. Thereafter, the camera shutter is closed and the accumulated image is stored in memory.

In another embodiment, a method is provided that opens a camera shutter in a maskless lithography system. As substrate moves, light is directed from at least one configuration of non-adjacent mirrors to the moving substrate. Images are captured and accumulated, continuously, in the camera to cover an entire camera field-of-view (FOV) on a first substrate layer on the moving substrate. Thereafter, the camera shutter is closed; and the accumulated image is stored in memory.

In yet another embodiment, a lithography system is provided that includes a light source. Also included is a mirror array that is adapted to have a configuration of non-adjacent mirrors, to receive light from the light source and is adapted to reflect light towards a substrate layer. A beam splitter is adapted to receive the light reflected from the mirror array and light reflected from the substrate layer. A camera is coupled to the beam splitter and is adapted to capture and accumulate images on the substrate layer that is visible due to the light reflected from the substrate layer. A processor is coupled to the light source, the mirror array to select the configuration of non-adjacent mirrors, the beam splitter, and the camera.

Other embodiments of this disclosure are provided that include other methods, apparatuses and systems having features similar to the apparatus and method described herein.

BRIEF DESCRIPTION OF THE DRAWINGS

So that the manner in which the above recited features of the present disclosure can be understood in detail, a more particular description of the disclosure, briefly summarized above, may be understood, reference is made herein to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 4A, 4B, 4C, and 4D depict simulated images illuminated by normal light reflected from an isolated mirror at different focus levels.

To facilitate understanding, identical reference numerals have been used, wherever possible, to designate identical elements that are common to the figures.

DETAILED DESCRIPTION

In the following description, numerous specific details are set forth to provide a more thorough understanding of this disclosure. As will be apparent to those skilled in the art, however, various changes using different configurations may be made without departing from the scope of this material. In other instances, well-known features have not been described in order to avoid obscuring this material. Thus, this disclosure is not considered limited to the particular illustrative embodiments shown in the specification and all such alternate embodiments are intended to be included in the scope of the appended claims.

The wavelengths used to illuminate the alignment mark(s) and/or feature(s) are different than the wavelengths in which a photoresist is sensitive. For example, a typical wavelength used to expose the photoresist to create a pattern is 403 nm. Therefore a wavelength of 403 nm is not used for illumination in alignment. Examples of wavelengths that can be used for illumination are about 400 nm to about 700 nm (excluding about 403 nm). Some typical colors that may be used in illumination are red (about 650 nm), amber (about 570 nm to about 620 nm) and blue (about 475 nm).

Figure 1:
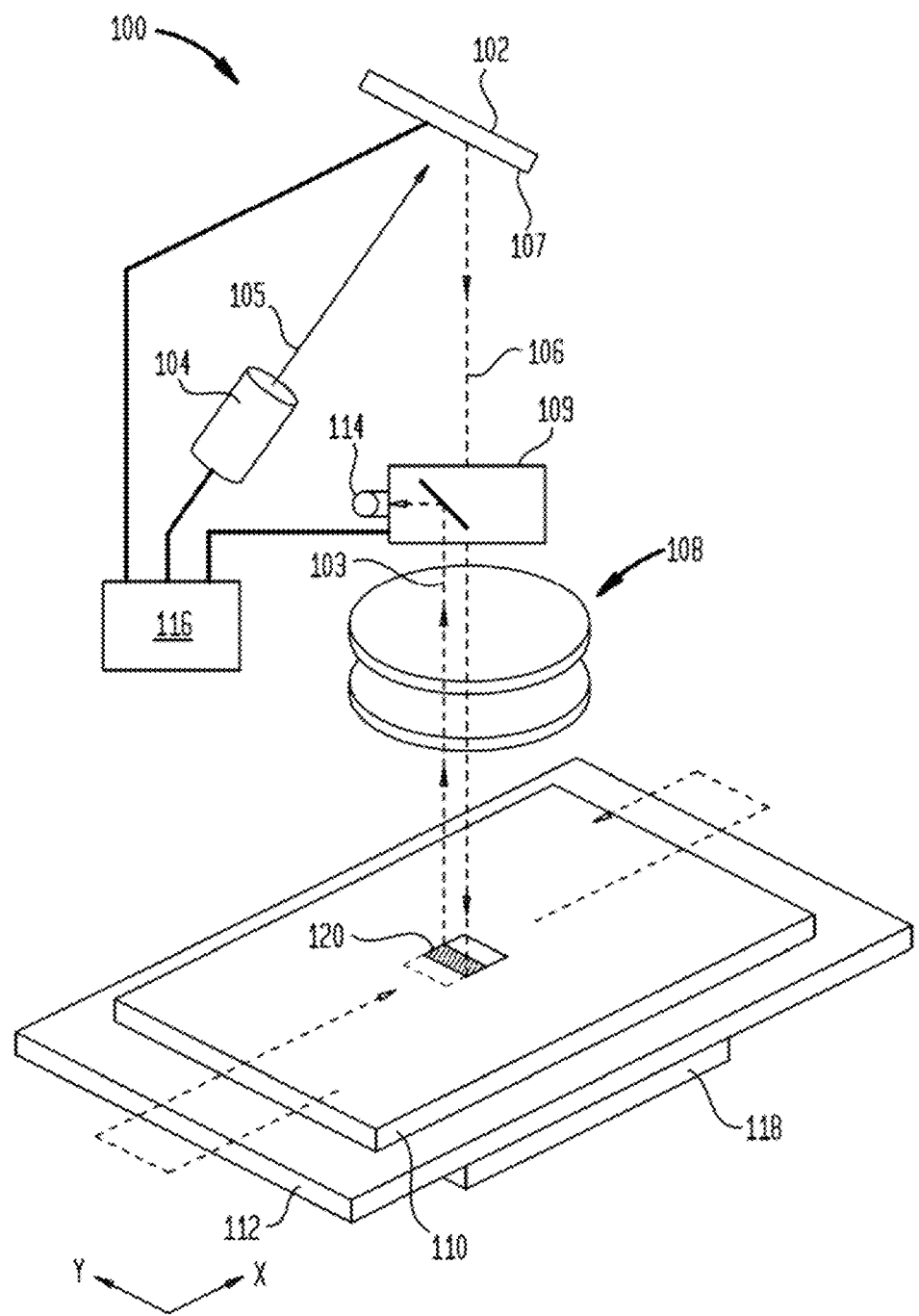
FIG. 1 depicts a perspective view of an apparatus in accordance with embodiments disclosed herein.

FIG. 1 depicts a perspective view of an system 100 in accordance with embodiments disclosed herein. The system 100 includes a micro-mirror array 102, a light source 104, projection optics 108, a camera 114, a beam-splitter 109, and a processor 116. The system 100 also includes a stage 112.

The processor 116 controls the light source 104, the camera 114 and the micro-mirror array 102. A plurality of mirrors in the micro-mirror array 102 is individually controlled by signals from the processor 116. In one embodiment, the micro-mirror array 102 may be a DLP9500-type digital mirror device made by Texas Instruments Incorporated of Dallas, Tex. The plurality of mirrors can have a number of mirrors arranged in many different ways. For example, in one embodiment, the plurality of mirrors is arranged in 1920 columns and 1080 rows.

Mirrors that are "turned ON" are defined herein as mirrors that have been positioned by the processor 116 to receive and redirect light towards the substrate 110. Mirrors that are "turned OFF" are defined herein as mirrors that have been positioned by the processor 116 so that they do not transmit light towards the substrate 110. Each mirror in the mirror array may be configured to be individually actuate-able (or digitally controlled) from an inactive position (i.e., turned "OFF") to an active position (i.e., turned "ON").

In an embodiment, the processor 116 sends instructions to the micro-mirror array 102 for at least one configuration of semi-isolated mirrors to reflect light towards the substrate 110. "Configuration" and "pattern" are used interchangeably herein. A "configuration of semi-isolated mirrors" as used herein is defined as a configuration of mirrors where any mirror that is turned ON and has an adjacent mirror is only adjacent to mirrors that are turned OFF. When a mirror is turned ON, mirrors immediately adjacent to that mirror are turned OFF. For example, the semi-isolated configuration can include a sequence such as ON, OFF, ON, etc. or a sequence such as ON, OFF, OFF, ON, etc.

The camera 114 may include an optical sensor (not shown), for example a charge coupling device, to read at least one alignment mark 120 on the substrate 110 to register the substrate 110 to the stage 112 and the micro-mirror array 102. The camera 114 may be coupled to the processor 116 to facilitate the determination of the relative locations of the alignment mark(s) and/or feature(s) on the substrate 110.

The stage 112 may support the substrate 110 and move the substrate 110 relative to the micro-mirror array 102. The stage 112 uses at least one motor 118 to move the substrate 110 relative to the micro-mirror array 102 in the X-direction and/or the Y-direction. The stage 112 may also include at least one linear encoder (not shown) to provide positional information to the processor 116 regarding changes in the position of the stage 112 in the X-direction and/or Y-direction.

Light 105 travels from the bottom surface 107 of the micro-mirror array 102 within an optical pathway 106 through the projection optics 108 towards the substrate 110. Light 103 is reflected from the substrate 110, goes through beam-splitter 109 towards the camera 114. The projection optics 108 may include a reduction ratio to reduce the size of the light 105 upon the substrate 110. The reduction ratio may be in a range from 2:1 to 10:1. In this regard, the projection optics 108 may include at least one lens including at least one convex surface and/or concave surface between the substrate 110 and the micro-mirror array 102. The projection optics 108 may include a material of high transmissibility (e.g., quartz) for various wavelengths of the light 105 to focus the light 105 upon the substrate 110.

Figure 2:
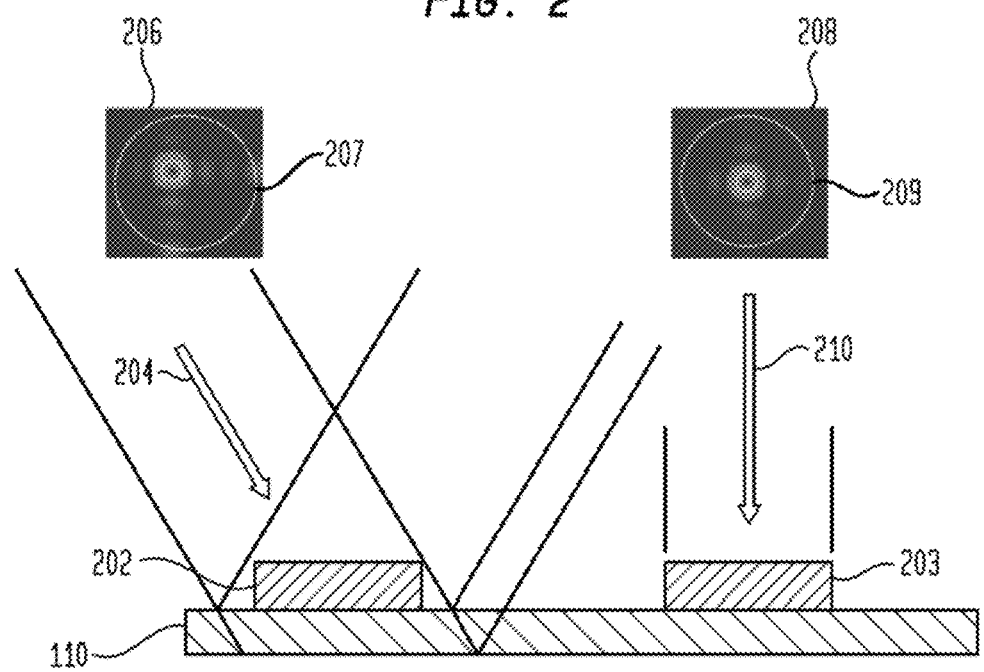
FIG. 2 depicts an example of illumination rays directed towards a substrate in accordance with embodiments disclosed herein.

FIG. 2 depicts an example of illumination rays directed towards a substrate 110 in accordance with embodiments disclosed herein. FIG. 2 depicts a substrate 110 having an alignment mark 202 and an alignment mark 203. Light rays 204 that are not normal (i.e., non-perpendicular) to the alignment mark 202 illuminate the alignment mark 202. Image 206 shows a simulation of the effects of illumination by non-perpendicular light rays 204. Specifically, a pupil 207 in image 206 is a representation of an illuminated portion of the alignment mark 202. The pupil 207 is offset from the center of the image 206. A pupil that is offset from the center of an image simulation is an indication that an identified location of the alignment mark is offset from the actual location of the alignment mark.

Light ray 210 represents light that is normal to alignment mark 203. Image 208 shows a simulation of the effects of illumination by perpendicular light ray 118. Specifically, image 208 includes a pupil 209 that is at the center of image 208. The centrally located pupil 209 in image 208 indicates there is little or no offset of the identified pupil 209 location with the actual location of pupil 209.

Figure 3:
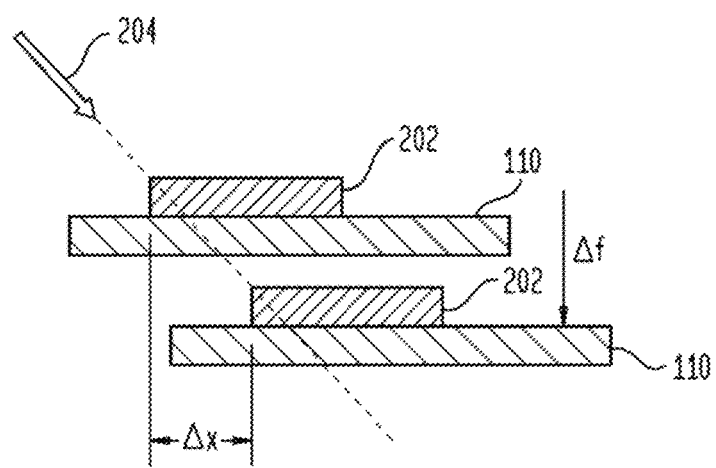
FIG. 3 depicts an example of a location offset of an alignment mark on a substrate layer due to light that is not normal to the substrate.

FIG. 3 depicts another view of the alignment mark 202 on substrate 110 and a location offset due to non-normal light 204. For simplicity, FIG. 3 only shows the location offset in one dimension (i.e., along the X-axis (i.e., "$\Delta x$")). FIG. 3 shows that non-normal light can produce an offset that can also be affected by a change in image focus (represented by "$\Delta f$").

FIGS. 4A, 4B, 4C, and 4D depict simulated images 400, 404, 402, and 406 respectively that are illuminated by normal light reflected from an isolated mirror at different focus levels. Because each of the images 400, 404, 402, and 406 are captured using light that is normal the pupils in each of these images is at the center.

The pupil 401 depicted in FIG. 4A is larger than the pupils 405, 403 and 407. As the size of a pupil increases so too does the amount of light that is not normal to the illuminated image. The radius, from the center of the pupil 401, of light is greater than the radius of light in pupils 405, 403 and 407. Light on an outer periphery of a pupil is not normal to the surface of the alignment mark 120. The greater the radius of the pupil then the greater the outer periphery and amount of non-normal light in the pupil.

Pupil 403, in FIG. 4C, is a simulated image at a different focus than that of pupil 401. Pupil 403 also has a smaller radius and less non-normal light than pupil 401. In FIG. 4D, pupil 407 has a positive defocus above the focus of pupil 403; and in FIG. 4B, pupil 405 has a negative defocus below the focus of pupil 403. Although pupils 401, 405, 403, and 407 have different foci, FIGS. 4A, 4B, 4C, and 4D show that images due to normal light are relatively insensitive to focus variations.

Figure 5:
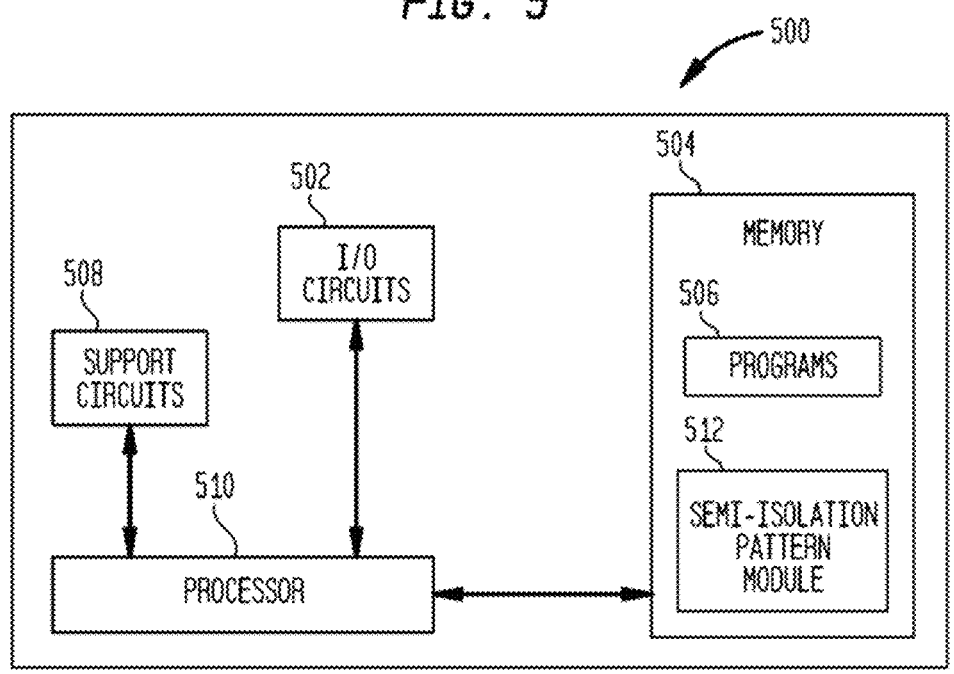
FIG. 5 depicts an embodiment of a high-level block diagram of a semi-isolated pattern generation system for reducing measurement error of an actual location of alignment mark and/or feature on a substrate in accordance with embodiments disclosed herein.

FIG. 5 depicts an embodiment of a high-level block diagram of a semi-isolated pattern generation system 500 for reducing location offset errors due to focus variation and sample thickness in accordance with embodiments disclosed herein. For example, the semi-isolated pattern generation system 500 is suitable for use in performing the methods of FIGS. 6 and 7. The semi-isolated pattern generation system 500 includes a processor 510 as well as a memory 504 for storing control programs and the like.

In various embodiments, memory 504 also includes programs that select and change a semi-isolated pattern configuration (e.g., "semi-isolation pattern module 512"). In other embodiments, the memory 504 includes programs (not shown) for controlling movement of stage 112.

The processor 510 cooperates with conventional support circuitry 508 such as power supplies, clock circuits, cache memory and the like as well as circuits that assist in executing the software routines 506 stored in the memory 504. As such, it is contemplated that some of the process steps discussed herein as software processes can be loaded from a storage device (e.g., an optical drive, floppy drive, disk drive, etc.) and implemented within the memory 504 and operated by the processor 510. Thus, various steps and methods of the present disclosure can be stored on a computer readable medium. The semi-isolated pattern generation system 500 also contains input-output circuitry 502 that forms an interface between the various functional elements communicating with the matching system 500 as well as a micro-mirror control system to load and display semi-isolated patterns on the micro-mirror array.

Although FIG. 5 depicts an semi-isolated pattern generation system 500 that is programmed to perform various control functions in accordance with the present disclosure, the term computer is not limited to just those integrated circuits referred to in the art as computers, but broadly refers to computers, processors, microcontrollers, microcomputers, programmable logic controllers, application specific integrated circuits, and other programmable circuits, and these terms are used interchangeably herein. In addition, although one semi-isolated pattern generation system 500 is depicted, that depiction is for brevity only. It is appreciated that each of the methods described herein can be utilized in separate systems or in the same system by software changes.

In one embodiment, the camera 114 captures the images in the camera 114. While the camera shutter is open, a first configuration of mirrors that are turned ON illuminate the substrate and captures an image. The image captured by the camera 114 is pixelated because each pixel in the camera acts as a sensor some of the camera pixels will not receive illumination reflected from the substrate (i.e., due to some of the mirrors are turned OFF). While the shutter is open, other configurations of mirrors are turned ON for illumination of the substrate; and capture of pixelated images by the camera 114. Each image accumulated can also be referred to as a "frame." The shutter is closed and the captured images are accumulated by combining each of the frames. In one embodiment, the camera shutter is kept open and the images are accumulated and processed in the camera 114 after the camera shutter is closed. In another embodiment, the camera shutter is closed and opened for each frame; and the accumulated images are sent to processor 116 for processing.

After the images are acquired image processing is performed. We also know the shape of the alignment mark and we correlate the image on the camera with the known alignment design. The correlation provides approximate position with respect to the center of the FOV of the camera 114. Based upon the location of the image with respect to the center of the FOV of the camera 114 the location of the alignment mark can be determined. Because the design of the alignment mark is known, the edges of the alignment mark can be detected to determine the shape of the alignment mark in the image. The processed image of the alignment mark can be compared to the design mark.

Figure 6:
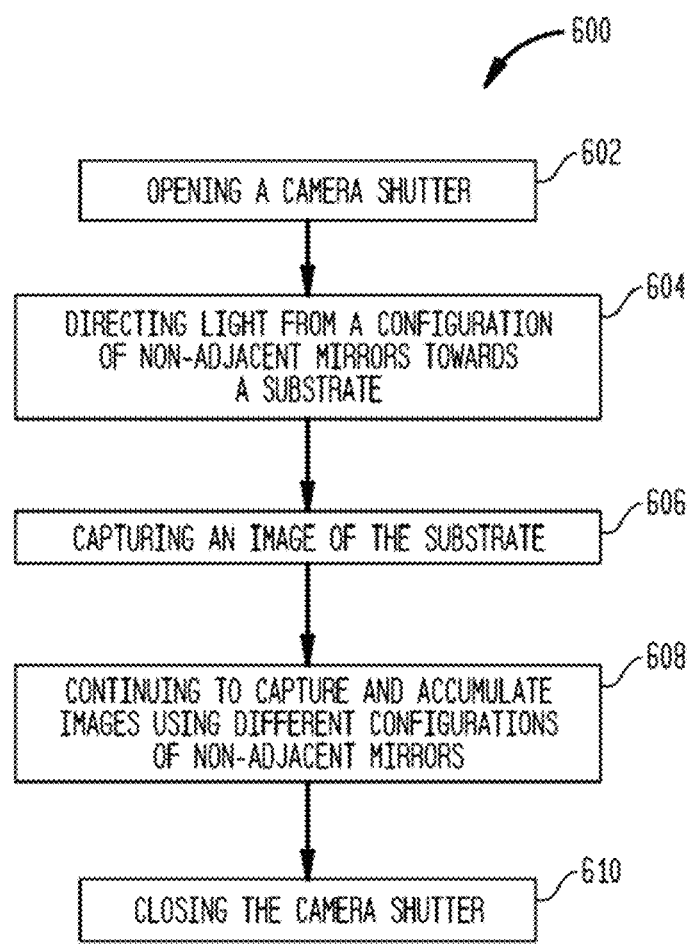
FIG. 6 depicts an embodiment of a method of detecting layer offset in accordance with embodiments disclosed herein.

FIG. 6 depicts an embodiment of a method 600 of reducing location offset of an alignment mark(s) and/or feature(s) in accordance with embodiments disclosed herein. At block 602, a camera shutter on the camera 114 is opened to capture images from lit portions of the substrate 110.

At block 604, light 105 from the light source 104 is directed towards the mirror array on the bottom surface 107 of the micro-mirror array 102. The processor 116 has turned some mirrors ON in the mirror array and some mirrors OFF to create a semi-isolated pattern configuration. For example, the first mirror can be turned ON and the mirrors immediately adjacent to that mirror are turned OFF (so that the sequence is ON, OFF, ON, OFF, etc.). The mirrors that are turned ON direct light towards the substrate 110 and light reflected from the substrate 110 is exposure light can illuminate an alignment mark. Mirrors that are turned OFF do not direct light towards the substrate 110. Those portions of the alignment mark 120 or feature on the substrate 110 that are illuminated are done so from light that is substantially normal to the illuminated portions of the substrate.

At block 606, the camera 114 starts to capture and accumulate images of the illuminated portions of the alignment mark 120. At block 608, the processor 116 changes the current semi-isolated pattern configuration to a different semi-isolated pattern configuration during image capturing and accumulating. For example, the different semi-isolated pattern can be the first mirror OFF and the second mirror ON (so that the sequence is OFF, ON, OFF, ON, etc.). Because the semi-isolated pattern is different, different portions of the alignment mark 120 on the substrate 110 are illuminated. The camera 114 captures and accumulates an image of the illuminated portions of the alignment mark 120. The processor 116 repeatedly changes the semi-isolated pattern configuration to illuminate different portions of alignment mark 120 within camera FOV and captures and accumulates the images of the illuminated portions until the entire FOV of the camera 114 is covered.

After all semi-isolated patterns are loaded and displayed on the micro-mirror the camera shutter is closed at block 610 on camera 114. Captured and accumulated images on the camera form a complete picture of the alignment mark 120 in the camera 114 FOV. The image is then stored in the memory 504 and processed in the processor 510 to find the location of the alignment mark within the camera FOV. Image processing algorithms such as correlation or edge detection can be used to find the location of the alignment mark.

Figure 7:
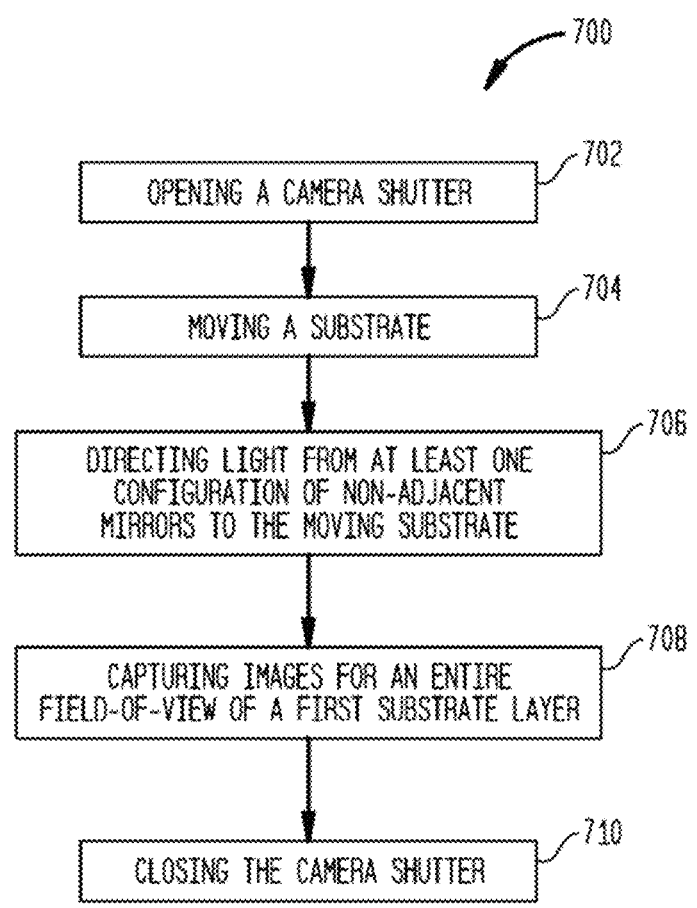
FIG. 7 depicts an embodiment of a method of detecting layer offset in accordance with embodiments disclosed herein.

FIG. 7 depicts an embodiment of a method 700 of detecting location offset of an alignment mark(s) and/or feature(s) in accordance with embodiments disclosed herein. At block 702, a camera shutter on the camera 114 is opened in preparation of capturing and accumulating images in the camera 114 from lit portions of the substrate 110. At block 704, the processor 116 moves the stage 112 relative to the micro-mirror array 102 as indicated above while the camera shutter is open. The processor 116 directs the stage 112 to slowly move (i.e., to move at a speed which allows all of the images to be captured) in a direction that is parallel to the X-direction and/or parallel to the Y-direction.

At block 706, light 105 from the light source 104 is directed towards the mirror array on the bottom surface 107 of the micro-mirror array 102. The processor 116 has turned some mirrors ON in the mirror array and some mirrors OFF to create a semi-isolated pattern configuration. For example, the first mirror can be turned ON and the mirrors immediately adjacent to that mirror are turned OFF (so that the sequence is ON, OFF, ON, OFF, etc.). The mirrors that are turned ON direct light towards the alignment mark 120 on the substrate 110. Those portions of the alignment mark 120 or feature on the substrate 110 that are illuminated are done so from light that is substantially normal to the illuminated portions of the substrate. At least one configuration of non-adjacent mirrors is illuminated while the stage 112 is moving. In one embodiment, multiple configurations of non-adjacent mirrors (i.e., the processor 116 changes the current semi-isolated pattern to at least one other semi-isolated pattern) are turned ON while the stage 112 is moving.

At block 708, the camera 114 continually captures and accumulates images of the illuminated portions of the alignment mark 120 in camera 104. The images captured are those portions of the alignment mark 120 that are illuminated. During this process all captured images are accumulated in the camera to create an image sampled within the camera FOV. At block 710, the camera shutter is closed to stop image accumulation on the camera 104. The image is then stored in the memory 504 and processed in the processor 510 to find the location of the alignment mark within the camera FOV. Image processing algorithms such as correlation or edge detection can be used to find the location of the alignment mark.

Although aspects have been described herein as utilizing methods and systems for increasing accuracy in layer alignment by reducing measurement error(s) in the actual location of an alignment mark(s), these descriptions are not intended in any way to limit the scope of the material described herein.

While the foregoing is directed to embodiments of the present invention, other and further embodiments of the invention may be devised without departing from the basic scope thereof, and the scope thereof is determined by the claims that follow.

We claim:

1. A method comprising:
opening a camera shutter in a maskless lithography system;
directing light from a first semi-isolated mirror configuration in a mirror array towards a first substrate layer;
capturing and accumulating a first image of the first substrate layer on a camera;
directing light from a second semi-isolated mirror configuration in the mirror array towards a first substrate layer;
capturing and accumulating a second image of the first substrate layer on the camera;
closing the camera shutter;
storing the accumulated first and second images in memory;
forming a third image from the first and second images; and
detecting an actual alignment mark in the third image.

2. The method of claim 1 further comprising:
measuring an actual alignment mark location on the first substrate layer from the third image by using image processing;
comparing designed alignment mark locations for the first substrate layer to the actual alignment mark location; and
determining, from the comparing designed alignment mark location for the first substrate layer, an offset of the actual alignment mark locations on the first substrate layer.

3. The method of claim 1 wherein the light is at a wavelength that is different than a wavelength of light used to etch.

4. The method of claim 1 further comprising:
opening the camera shutter;
directing light from the first semi-isolated mirror configuration in the mirror array towards a second substrate layer that is on top of the first substrate layer;
capturing and accumulating a fourth image of the second substrate layer on the camera;
directing light from the second semi-isolated mirror configuration in the mirror array towards the second substrate layer;
capturing and accumulating a fifth image of the second substrate layer on the camera;
closing the camera shutter;
forming a sixth image from the fourth and fifth images; and
detecting the actual alignment mark in the sixth image.

5. The method of claim 4 further comprising:
measuring the actual alignment mark location on the second substrate layer from the sixth image using image processing to determine the actual mark location;
comparing a designed alignment mark location for the second substrate layer to the actual alignment mark location; and
determining, from the comparing designed alignment mark location for the second substrate layer, an offset of the actual alignment mark location on the second substrate layer.

6. The method of claim 4 further comprising:
measuring actual alignment mark location on the second substrate layer from the sixth image of the second substrate layer;
comparing designed alignment mark location for the first substrate layer to the actual alignment mark locations on the second substrate layer; and
determining, from the comparing designed alignment mark locations for the second substrate layer, an offset to align the actual alignment mark locations on the second substrate layer to the designed alignment mark locations on the first substrate layer.

7. A method comprising:
opening a camera shutter in a maskless lithography system;
moving a substrate;
directing light from a first semi-isolated configuration of a mirror array to the moving substrate;
capturing and accumulating, a first set of images in the camera to cover an entire camera field-of-view (FOV) on a first substrate layer on the moving substrate;
directing light from a second semi-isolated configuration of the mirror array to the moving substrate;
capturing and accumulating a second set of images in the camera to cover an entire camera field of view (FOV) on a first substrate layer on the moving substrate;
closing the camera shutter;
storing the accumulated first and second sets of images in memory;
forming a third image from the first and second sets of images; and
detecting an actual alignment mark in the third image.

8. The method of claim 7 further comprising:
measuring an actual alignment mark location on the first substrate layer from the third image by using image processing;

comparing a designed alignment mark location for the first substrate layer to the actual alignment mark location; and determining, from the comparing designed alignment mark location for the first substrate layer, an offset of the actual alignment mark location on the first substrate layer.

9. The method of claim 7 wherein the light is at a wavelength that is different than a wavelength of light used to etch.

10. The method of claim 7 further comprising:
moving the substrate;
opening the camera shutter;
directing light from the first semi-isolated configuration of the mirror array to the moving substrate;
capturing and accumulating, continuously, a fourth set of images to cover the entire FOV on a second substrate layer on the moving substrate;
directing light from the second semi-isolated configuration of a mirror array to the moving substrate;
capturing and accumulating, continuously, a fifth set of images to cover the entire FOV on a second substrate layer on the moving substrate;
closing the camera shutter;
storing the accumulated fourth and fifth sets of images in memory
forming a sixth image from the fourth and fifth sets of images; and
detecting an actual alignment mark in the sixth image.

11. The method of claim 10 further comprising:
measuring the actual alignment mark location on the second substrate layer from the sixth image by using image processing;
comparing a designed alignment mark location for the second substrate layer to the actual alignment mark location on the second substrate layer; and
determining, from the comparing designed alignment mark location for the second substrate layer, an offset of the actual alignment mark location on the second substrate layer.

12. The method of claim 10 further comprising:
measuring the actual alignment mark location on the second substrate layer from the sixth image by using image processing;
comparing the designed alignment mark location for the first substrate layer to the actual alignment mark location on the second substrate layer; and
determining, from the comparing designed alignment mark location for the second substrate layer, an offset to align the actual alignment mark location on the second substrate layer to the designed alignment mark location on the first substrate layer.

13. A lithography system comprising:
a light source;
a mirror array is adapted to have a first semi-isolated mirror configuration and a second semi-isolated mirror configuration, to receive light from the light source and is adapted to reflect light towards a substrate layer;
a beam splitter adapted to receive the light reflected from the mirror array and light reflected from the substrate layer;
a camera coupled to the beam splitter and adapted to capture and accumulate images on the substrate layer that are visible due to the light reflected from the substrate layer; and
a processor coupled to the light source, the mirror array to select at least one of the first and second semi-isolated mirror configurations, the beam splitter, and the camera, the processor configured to:
    capture a first image, using the camera, of the substrate layer that is visible due to the reflected light to the substrate layer from the mirror array in the first semi-isolated mirror configuration;
    capture a second image, using the camera, of the substrate layer that is visible due to the reflected light to the substrate layer from the mirror array in the second semi-isolated mirror configuration;
    form a third image from the first and second image; and
    detect an alignment mark in the third image.

14. The system of claim 13 further comprising:
a stage that is adapted to support the substrate layer, wherein a position of the stage is fixed with respect to the substrate layer, the stage is adapted to receive instructions from the process to move in at least one of a direction parallel to an X-axis and a direction parallel to a Y-axis, while the camera captures images.

15. The system of claim 13 wherein the captured images are one of an alignment mark and a feature on the substrate layer.

16. The system of claim 13 wherein the processor is adapted to change the configuration of the mirror array to at least one other configuration of the first and second semi-isolated mirror configuration while the camera captures images.

17. The system of claim 13 wherein,
the mirror array is adapted to receive light from the light source and reflect light towards a different substrate layer;
the beam splitter is adapted to receive light reflected from the different substrate layer; and
the camera is adapted to capture and accumulate images on the different substrate layer that are visible due to the light reflected from the different substrate layer.

* * * * *